(12) United States Patent
Jiang et al.

(10) Patent No.: US 9,164,338 B2
(45) Date of Patent: Oct. 20, 2015

(54) ARRAY SUBSTRATE, LIQUID CRYSTAL DISPLAY PANEL AND DRIVING METHOD

(71) Applicant: BEIJING BOE OPTOELECTRONICS TECHNOLOGY CO., LTD., Beijing (CN)

(72) Inventors: Wenbo Jiang, Beijing (CN); Xue Dong, Beijing (CN); Hailin Xue, Beijing (CN); Xiaochuan Cheng, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 50 days.

(21) Appl. No.: 14/006,806

(22) PCT Filed: Jan. 22, 2013

(86) PCT No.: PCT/CN2013/070849
§ 371 (c)(1),
(2) Date: Sep. 23, 2013

(87) PCT Pub. No.: WO2014/089925
PCT Pub. Date: Jun. 19, 2014

(65) Prior Publication Data
US 2014/0168045 A1    Jun. 19, 2014

(51) Int. Cl.
*G02F 1/1362* (2006.01)
*H01L 27/12* (2006.01)
(Continued)

(52) U.S. Cl.
CPC ........ *G02F 1/136286* (2013.01); *H01L 27/124* (2013.01); *G02F 1/1368* (2013.01); *G02F 1/133512* (2013.01); *G02F 2201/40* (2013.01)

(58) Field of Classification Search
CPC .............. G02F 1/133512; G02F 1/136286; G02F 1/1368; G02F 2201/40; H01L 27/124
USPC ........................................ 345/98, 93
See application file for complete search history.

(56) References Cited

U.S. PATENT DOCUMENTS

2005/0094077 A1    5/2005  Baek
2009/0135125 A1*   5/2009  Park ............................ 345/98
(Continued)

FOREIGN PATENT DOCUMENTS

CN    101799605 A    8/2010
CN    202948237 U    5/2013
(Continued)

OTHER PUBLICATIONS

First Office Action issued by the Korean Patent Office for Korean Patent Application No. 10-2013-7025500 dated Jul. 30, 2014, 4pgs.
(Continued)

*Primary Examiner* — Quan-Zhen Wang
*Assistant Examiner* — Tony Davis

(57) ABSTRACT

Embodiments of the invention disclose an array substrate, a liquid crystal display panel and a driving method for increasing aperture ratio of a pixel area, avoiding display horizontal stripes caused by difference in shape between black matrices in adjacent rows and improving display quality. The array substrate comprises: a plurality of data lines and a plurality of gate lines which are provided to intersect each other, and a plurality of pixel units, which are defined by enclosing by the plurality of data lines and the plurality of gate lines and are arranged in an array form, and each of which comprises a thin film transistor and a pixel electrode, the thin film transistor comprising a gate electrode, a source electrode connected to a corresponding data line and a drain electrode connected to the pixel electrode; two gate lines which are adjacent to each other are located between corresponding pixel units in two adjacent rows driven by the two gate lines, and for each of the pixel units in the two adjacent rows, a connection position of the drain electrode of the thin film transistor and the pixel electrode is between the two gate lines or over one corresponding gate line.

9 Claims, 7 Drawing Sheets

(51) Int. Cl.
　　　*G02F 1/1335*　　　(2006.01)
　　　*G02F 1/1368*　　　(2006.01)

(56) References Cited

U.S. PATENT DOCUMENTS

| | | | |
|---|---|---|---|
| 2009/0219469 A1* | 9/2009 | Kim | 349/106 |
| 2010/0320472 A1* | 12/2010 | Liu | 257/59 |
| 2012/0050630 A1* | 3/2012 | Sato et al. | 349/33 |
| 2014/0118652 A1* | 5/2014 | ZHANG et al. | 349/43 |
| 2014/0125909 A1* | 5/2014 | Kim et al. | 349/46 |

FOREIGN PATENT DOCUMENTS

| | | | |
|---|---|---|---|
| JP | 2003280000 A | 10/2003 |
| JP | 2005134914 A | 5/2005 |
| JP | 2005292848 A | 10/2005 |
| KR | 2011-0105893 A | 9/2011 |

OTHER PUBLICATIONS

English translation of First Office Action issued by the Korean Patent Office for Korean Patent Application No. 10-2013-7025500 dated Jul. 30, 2014, 3pgs.

English translation of Korean Patent Application No. 2011-0105893, 19pgs.

English abstract of JP2003280000(A) listed above, one (1) page.

English abstract of JP2005292848(A) listed above, one (1) page.

Notice of Allowance for related Korean Application No. 2014-087015271, dated Dec. 19, 2014; five (5) pages.

International Search Report (Chinese language) issued by the State Intellectual Property Office ("SIPO") on Sep. 10, 2013 for International Application No. PCT/CN2013/070849, 14 pages.

English abstract of CN202948237U, listed above, 1 page.

First Office Action (Chinese language) issued by SIPO on Nov. 2, 2014 for priority International Application No. 201210541481.8, 5 pages.

English translation for first Office Action issued by SIPO (listed above) for priority International Application No. 201210541481.8, 3 pages.

English abstract of CN101799605A, listed above in Foreign Patent Documents, 1 page.

PCT International Preliminary Report on Patentability issued on Jun. 16, 2015 by the International Bureau of WIPO for International Application No. PCT/CN2013/070849, 7 pages.

\* cited by examiner

ARRAY SUBSTRATE, LIQUID CRYSTAL DISPLAY PANEL AND DRIVING METHOD

CROSS REFERENCE TO RELATED APPLICATIONS

This application is based on International Application No. PCT/CN2013/070849 filed on Jan. 22, 2013, which claims priority to Chinese National Application No. 201210541481.8, filed on Dec. 13, 2012, the contents of which are incorporated herein by reference.

TECHNICAL FIELD

Embodiments of the present invention relate to an array substrate, a liquid crystal display panel, and a driving method.

BACKGROUND

People has more and more needs for liquid crystal display products of Advanced Super Dimension Switch (ADS) technology, and have an increasingly high requirements of control on power consumption of products as well, and this requires that aperture ratio of pixel units should reach a higher level to reduce the power consumption. In addition to control on processes, improvement of design has become an important way to increase aperture ratio.

In a conventional ADS mode liquid crystal display product to which common electrodes are incorporated, the common electrodes are connected to common electrode lines (e.g. an ITO layer) periodically through via holes, which serves a function of connecting the common electrodes in parallel so as to decrease the resistance. Referring to FIG. 1, in the array substrate as shown, a pixel unit A is defined by enclosing of a gate line 101, two longitudinal data lines 102 and a common electrode line 103, and protrusive parts on the gate line 101 functioning as gate electrodes extend toward corresponding pixel units driven by the gate electrodes, which results in the result that space on the array substrate cannot be effectively utilized. Furthermore, a via hole B for connecting a source electrode of a thin film transistor to a pixel electrode for each of pixel units is located within a display area of the pixel unit. In order to prevent light leakage, a black matrix (BM, not shown in the drawing) is typically formed on a color filter substrate to provided shield, the color filter substrate is used in conjunction with the array substrate, and the configuration decreases aperture ratio of the pixel units to a great extent, and moreover, due to a precision problem encountered when the array substrate and the color filter substrate are disposed opposite to each other, light leakage at the via hole may be still incurred.

In addition, in the conventional ADS mode product to which common electrodes are incorporated, thin film transistors and a gate line are shielded by a row of black matrix on the color filter substrate over the gate line of the array substrate, this row of black matrix has an irregular shape and does not conform to the row of black matrix on the color filter substrate, which is located over the common electrode line of the array substrate and has a regular shape. As such, horizontal stripes will occur in a finally finished product, and in turn, luminance difference between adjacent rows leads to abnormal display on the whole screen.

SUMMARY

Embodiments of the present invention provide an array substrate, a liquid crystal display panel and a driving method, for increasing aperture ratio of pixel units, avoiding occurrence of horizontal stripes in display due to difference in shape between black matrices in adjacent rows and improving display quality.

An array substrate which is provided by an embodiment of the invention comprises: a plurality of data lines and a plurality of gate lines which are provided to intersect each other, and a plurality of pixel units, which are defined by enclosing by the plurality of data lines and the plurality of gate lines and are arranged in an array form, and each of which comprises a thin film transistor and a pixel electrode, the thin film transistor comprising a gate electrode, a source electrode connected to a corresponding data line and a drain electrode connected to the pixel electrode, wherein two gate lines which are adjacent to each other are located between corresponding pixel units in two adjacent rows driven by the two gate lines, and for each of the pixel units in the two adjacent rows, a connection position of the drain electrode of the thin film transistor and the pixel electrode is between the two gate lines or over one corresponding gate line.

A liquid crystal display panel which is provided by an embodiment of the invention comprises a color filter substrate and an array substrate which are disposed opposite to each other, wherein the array substrate is the above-mentioned array substrate.

A driving method for driving the above array substrate which is provided by an embodiment of the invention comprises:

with respect to the two gate lines which are adjacent and located between the pixel units in the two adjacent rows, a gate line in a following row of the two gate lines which are adjacent is scanned earlier, and a gate line in a preceding row of the two gate lines which are adjacent is scanned later; or, a gate line in a preceding row of the two gate lines which are adjacent is scanned earlier, and a gate line in a following row of the two gate lines which are adjacent is scanned later.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
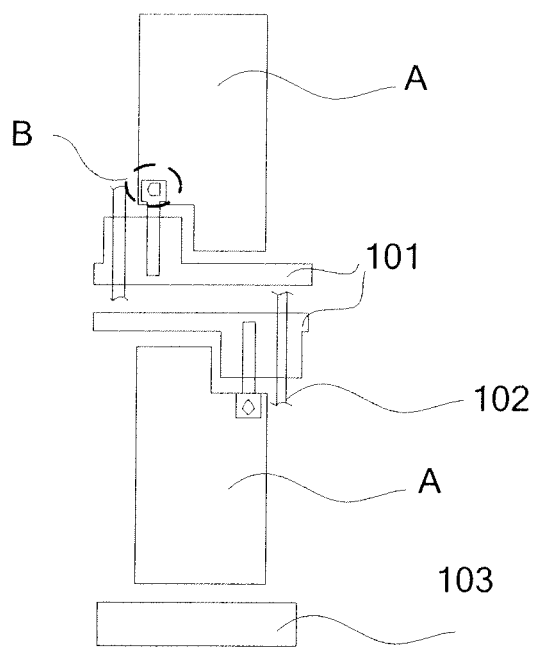
FIG. 1 is a schematically top view showing the structure of an existing TFT array substrate.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," "the" or the like does not indicate limitation in number, but specifies the presence of at least one. A term "comprises," "comprising," "comprises," "comprising", "contains" or the like means that an element or article ahead of this term encompasses element(s) or article(s) listed behind this term and its (their) equivalents, but does not preclude the presence of other elements or articles. A term "connection," "connected," or the like is not limited to physical or mechanical connection, but can comprise electrical connection, whether directly or indirectly. "Upper," "lower," "left," "right" or the like is only used to describe a relative positional relationship, and when an absolute position of the described object is changed, the relative positional relationship might also be changed accordingly.

An embodiment of the present invention provides an array substrate, a liquid crystal display panel and a driving method, for increasing aperture ratio of pixel units, avoiding occurrence of horizontal stripes in display due to difference between black matrices for adjacent rows, and improving display quality.

An array substrate which is provided by an embodiment of the invention comprises: a plurality of data lines and a plurality of gate lines which intersect each other, and a plurality of pixel units, which are defined by enclosing of the plurality of data lines and the plurality of gate lines and are arranged in an array form, and each of pixel units comprises a thin film transistor and a pixel electrode; the thin film transistor comprises a gate electrode, a source electrode connected to a corresponding data line, and a drain electrode connected to the pixel electrode; two gate lines which are adjacent to each other are located between corresponding pixel units in two adjacent rows driven by the two gate lines, and for each of the pixel units in the two adjacent rows, a connection position of the drain electrode of the thin film transistor and the pixel electrode is between the two gate lines or over one corresponding gate line.

Further, for example, for each of the pixel units in the two adjacent rows, the drain electrode of the thin film transistor and the pixel electrode are connected through a first via hole.

Further, for example, the gate lines comprise protrusions, and protrusions of the two gate lines which are adjacent to each other for driving pixel units in the two adjacent rows are staggered and opposed in a column direction.

Further, for example, a gate line in a preceding row of the two gate lines which are adjacent acts to drive pixel units in a following row of the pixel units in the two adjacent rows, and a gate line in a following row of the two gate lines which are adjacent acts to drive pixel units in a preceding row of the pixel units in the two adjacent rows; or, possibly a gate line in a preceding row acts to drive pixel units in a preceding row, and a gate line in a following row acts to drive pixel units in a following row.

Further, for example, the substrate further comprises a plurality of common electrode lines, and two adjacent rows of the common electrode lines are separated by the pixel units in the two adjacent rows, and the common electrode lines are connected to common electrodes of the pixel units through second via holes.

Further, for example, the number of the via holes for connecting the common electrode lines and the common electrodes is at least two.

For example, the common electrodes may be formed of a transparent electrode material such as Indium Tin Oxide (ITO), but the resistance of ITO is usually larger, while the common electrode lines are usually produced in the same layer as a gate-line metal layer (GATE), which has smaller resistance. Thus, connecting the common electrode lines to the common electrodes can reduce resistance of the common electrodes, and response speed of signals can be improved thereby. Moreover, the more the number of common electrode lines is, the better the effect is, and it is preferable that the number is the same as the number of columns of the pixel units. The reason is that the common electrode lines are produced of a metal material which has smaller resistance than that of the material for a common electrode layer, and accordingly, the more the number of common electrode lines is, the smaller the resistance is. In practice, it is preferable that the number of the common electrode lines is the same as the number of columns of the pixel units; on the other hand, if the number exceeds the number of columns of the pixel units, then an additional black matrix is needed in terms of process for shielding, and in turn, cost is increased.

Figure 2:
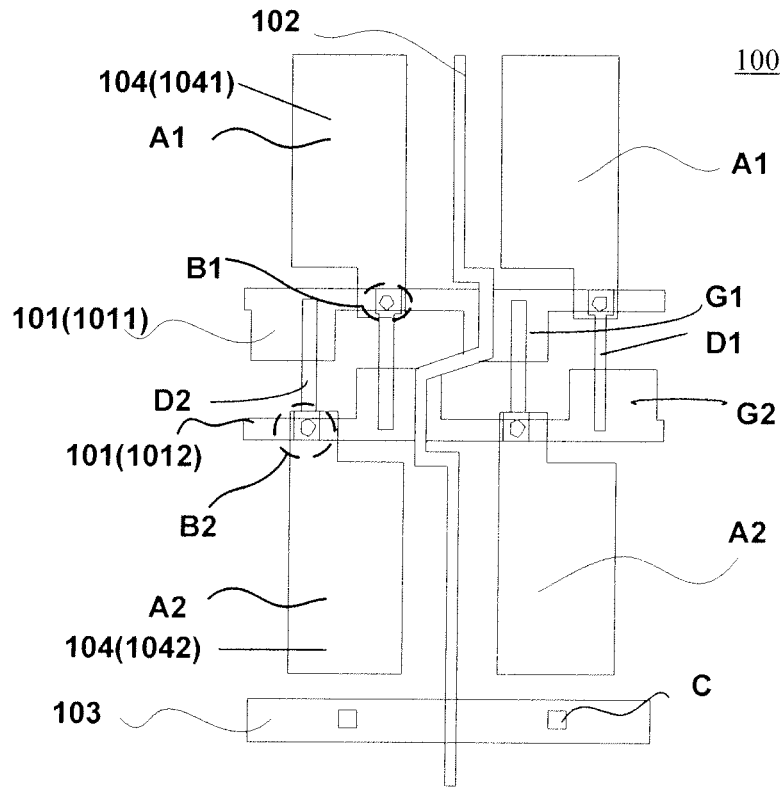
FIG. 2(a) is a schematically top view showing the structure of a TFT array substrate provided by an embodiment of the invention.
FIG. 2(b) is a schematically top view showing the structure of another TFT array substrate provided by an embodiment of the invention.
Figure 2:
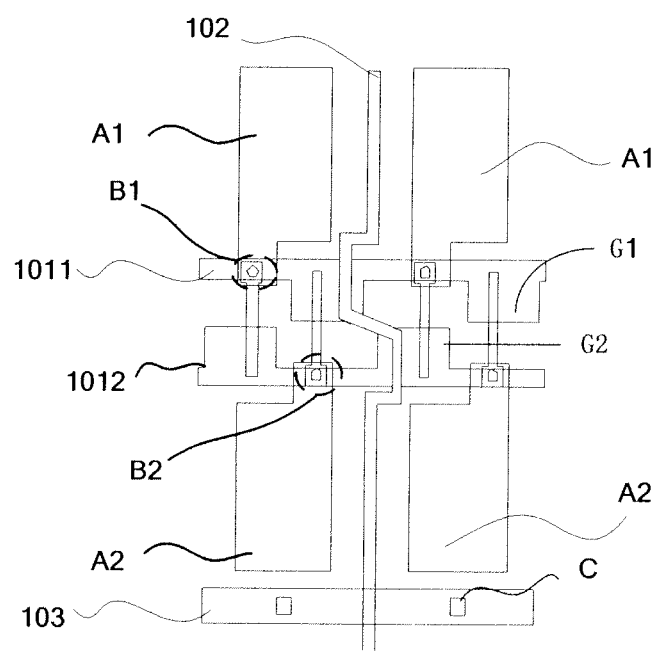

FIG. 2(a) shows a thin film transistor (TFT) array substrate 100 provided by an embodiment of the invention. The array substrate 100 comprises a plurality of gate lines 101, a plurality of data lines 102 and a plurality of common electrode lines 103, which are provided and intersect with each other on a base substrate (not shown). As shown in the drawing, the gate lines 101 and the common electrode lines 103 extend transversely, and the data lines 102 extend longitudinally. The data lines 102 and the gate lines 101 intersect each other so as to define a plurality of pixel units arranged in an array form by way of surrounding, and an upper pixel unit A1 and a lower pixel unit A2 in two adjacent columns of pixel units are shown in the drawing as an example only. For each of the pixel units, on two sides of it in the upper and lower directions are provided gate lines and common electrode lines, respectively, and on both left and right sides are provided data lines. Each of the pixel units A1, A2 comprises a TFT which functions as a switch element and a pixel electrode 104 (1041, 1042). Each of the data lines 102 is located between two adjacent columns of pixel units, and as shown in the drawing, the data line 102 acts to drive the pixel unit A2 in the left column and the pixel unit A1 in the right column of the two adjacent columns of pixel units alternately; two adjacent rows of gate lines 101 (1011, 1012) are located between the pixel units in two adjacent rows which are driven by them. Gate electrodes of TFTs of two pixel units (i.e. A1, A2) in the same column of the pixel units in the two adjacent rows are staggered and opposed, and two adjacent rows of common electrode lines 103 are separated by two rows of pixel units; the common electrode line 103 located at the top is omitted in FIG. 2(*a*). Only four adjacent pixel units are shown in FIG. 2(*a*) as an example for the purpose of facilitating description.

With respect to gate lines 101 for two adjacent pixel units A1, A2 in the same column, in the drawing a protrusion G1 for the gate line 1011 in a preceding row shown and a protrusion G2 for the gate line 1012 in a following row have staggered locations and are arranged to be opposed; namely, in the drawing the protrusion G1 extends downward in a vertical direction, the protrusion G2 extends upward in the vertical direction in the drawing, and the protrusion G1 and protrusion G2 are mutually staggered but not face each other. The gate line 1011 acts to drive pixel units A2, and the gate line 1012 acts to drive pixel units A1. It is to be noted that, the gate lines 1011, 1012 employed in the embodiment have protrusions G1 and G2, however, this description has been given with reference to an example in which gate lines have protrusions only but cannot be used to limit the invention. For example, straight-line gate lines may also be employed, as long as such case does not depart from the object of the invention. The above protrusions G1, G2 function as gate electrodes of TFTs.

Meanwhile, as shown in FIG. 2(*a*), for a same column, the connection location of the first via hole B1, for connecting the drain electrode D1 of the TFT for the pixel unit A1 in a preceding row to a corresponding pixel electrode 1041, is located within the region of the gate line 1011 for the TFT of a pixel unit A2; in the direction of light transmission (i.e. the direction in the drawing which is perpendicular to the paper plane), the projection of the via hole location B1 completely falls within the projection of the gate line 1011 for the pixel unit A2 in the following row; namely, this configuration ensures that the via hole B1 is fully located under the shielding of a corresponding black matrix, and thus aperture ratio will not be affected. Likewise, with respect to the pixel unit A2, the connection location of the first via hole B2, for connecting the drain electrode D2 of the TFT for it to a corresponding pixel electrode 1042, is located within the region of a gate line 1012 for the TFT of the pixel unit A1; in the direction of light transmission, the projection of the via hole location B2 completely falls within the projection of the gate line 1012 for the pixel unit A1 in a preceding row. Or, via holes B1, B2 for connecting drain electrodes D1, D2 and corresponding pixel electrodes 1041, 1042 may also be located between the above adjacent gate lines 1011, 1012, and it can be ensured that the locations of the via holes will not affect aperture ratio of the pixel units, as long as the via holes B1, B2 can surely fall within the projection of the black matrix corresponding to the gate lines 1011, 1012. Upon practice, it is also unnecessary to add extra shielding with respect to the locations of the via holes. Here, the black matrix corresponding to the gate lines 1011, 1012 refers to the black matrix on a counter substrate (e.g. a color filter substrate) which is disposed in opposition to the array substrate according to the embodiment so as to form a liquid crystal cell, and thus is not shown in FIG. 2(*a*).

The drain electrode D1 stated as above extends to overlap the protrusion G2 of the gate line 1012 so as to constitute a thin film transistor for a pixel unit A1 together with a portion (functioning as a source electrode) of the corresponding data line 102 which overlaps the protrusion G2; and a drain electrode D2 extends to overlap the protrusion G1 of the gate line 1011 so as to constitute another thin film transistor for a pixel unit A2 together with a portion (functioning as a source electrode) of the corresponding data line 102 which overlaps the protrusion G2. For the sake of simplicity and convenience, semiconductor layers of the thin film transistors and so on are not shown.

As can be seen from FIG. 2(*a*), there are locations C for second via holes on a common electrode line 103, and the locations C for the second via holes are connection locations of common electrodes (not shown in the drawing) in pixel units and the common electrode line. The common electrode and the pixel electrode in a pixel unit cooperate to form a liquid crystal driving electric field. One common electrode line 103 can be used by two pixel units in upper and lower directions with respect to this common electrode line.

The above design of the array substrate can make sure that black matrices on the counter substrate have a uniform shape. That is, because two adjacent gate lines and a common electrode line are arranged alternately, respective black matrices can be designed to have the same shape correspondingly when the common electrode line and the two adjacent gate lines occupy the same area of the array substrate. This makes sure that black matrices for adjacent rows have the same shape as well, and display horizontal stripes which are caused by the difference in shape between the black matrices for adjacent rows will not occur during display. Furthermore, if a pixel electrode and a drain electrode are connected with a via hole, then with the above design, a corresponding black matrix will not be extra added for shielding, and aperture ratio of the pixel unit is improved.

Figure 3:
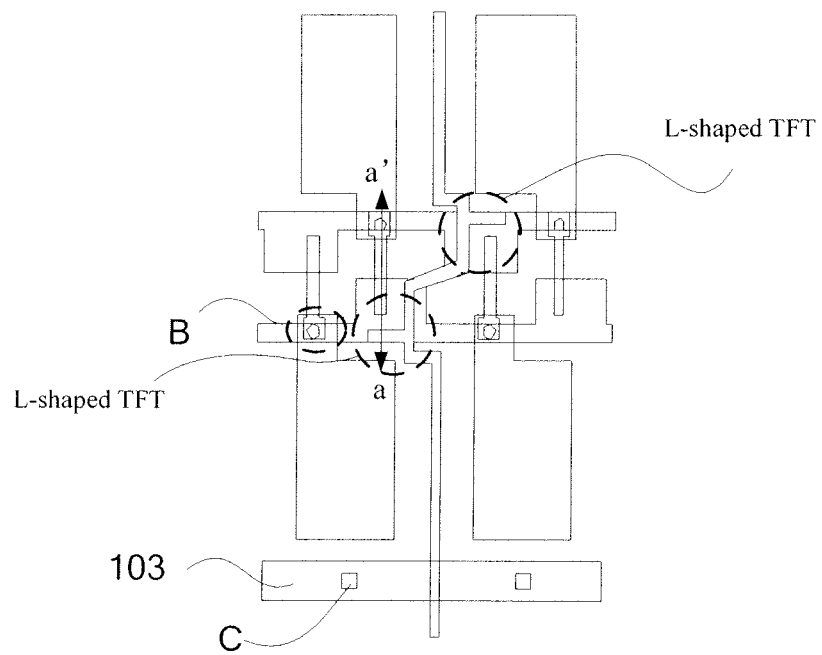
FIG. 3 is a schematically top view showing the structure of an array substrate using L-shaped TFTs provided by an embodiment of the invention.
Figure 4:
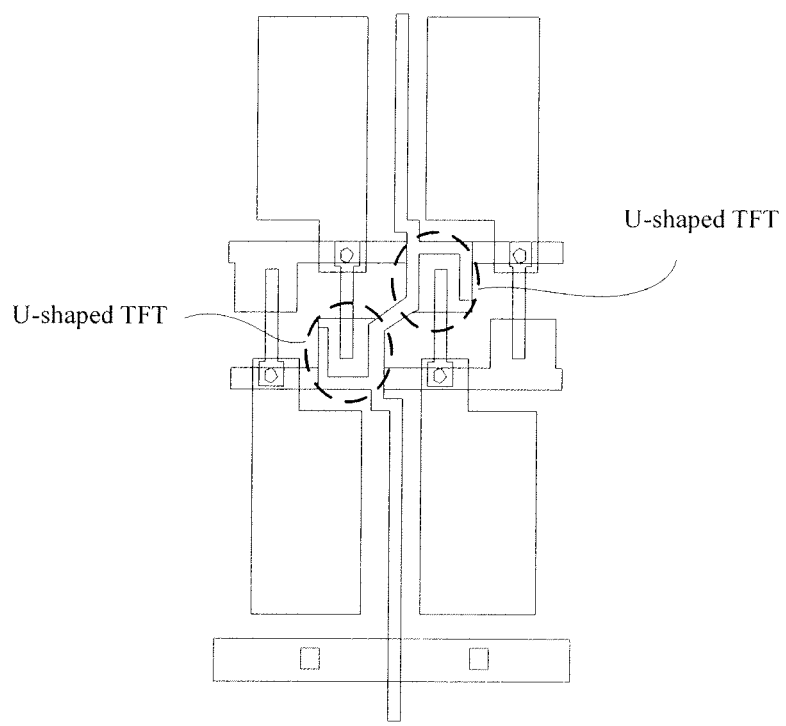
FIG. 4 is a schematically top view showing the structure of an array substrate using U-shaped TFTs provided by an embodiment of the invention.

Based on the TFT array substrate shown in FIG. 2(*a*), in another embodiment, a modification shown in FIG. 2(*b*) may be adopted. The embodiment of FIG. 2(*b*) and the embodiment of FIG. 2(*a*) only differ in that, protrusions G1, G2 functioning as gate electrodes on gate lines 1011, 1012 are changed in their positions in the left-right direction in the drawing. In addition, a straight-line type TFTs are used for TFTs shown in FIG. 2(*a*) and FIG. 2(*b*), and the prevent invention is not limited to TFTs of this structure. For example, L-shaped and U-shaped TFTs also can be used, which are shown in FIG. 3 and FIG. 4, respectively. That is, shapes of portions of data lines 102 which overlap the protrusions G1, G2 to function as source electrodes of thin film transistors are an L shape and a U shape.

It is to be noted that, the connection of data lines 102 in the array substrate provided by the embodiments of the invention is not limited to the connection manner given in the above embodiments, but other connection manners of data lines may also be used; the drain electrodes D1, D2 and the pixel electrodes 1041, 1042 may not be connected through via holes B1, B2, and other manners may also be used. For example, they are connected by way of directly overlapping, as long as connection can be realized.

Hereinafter, a technical solution provided by an embodiment of the invention will be further described in detail in combination with cross-sectional views of an array substrate.

Figure 5:
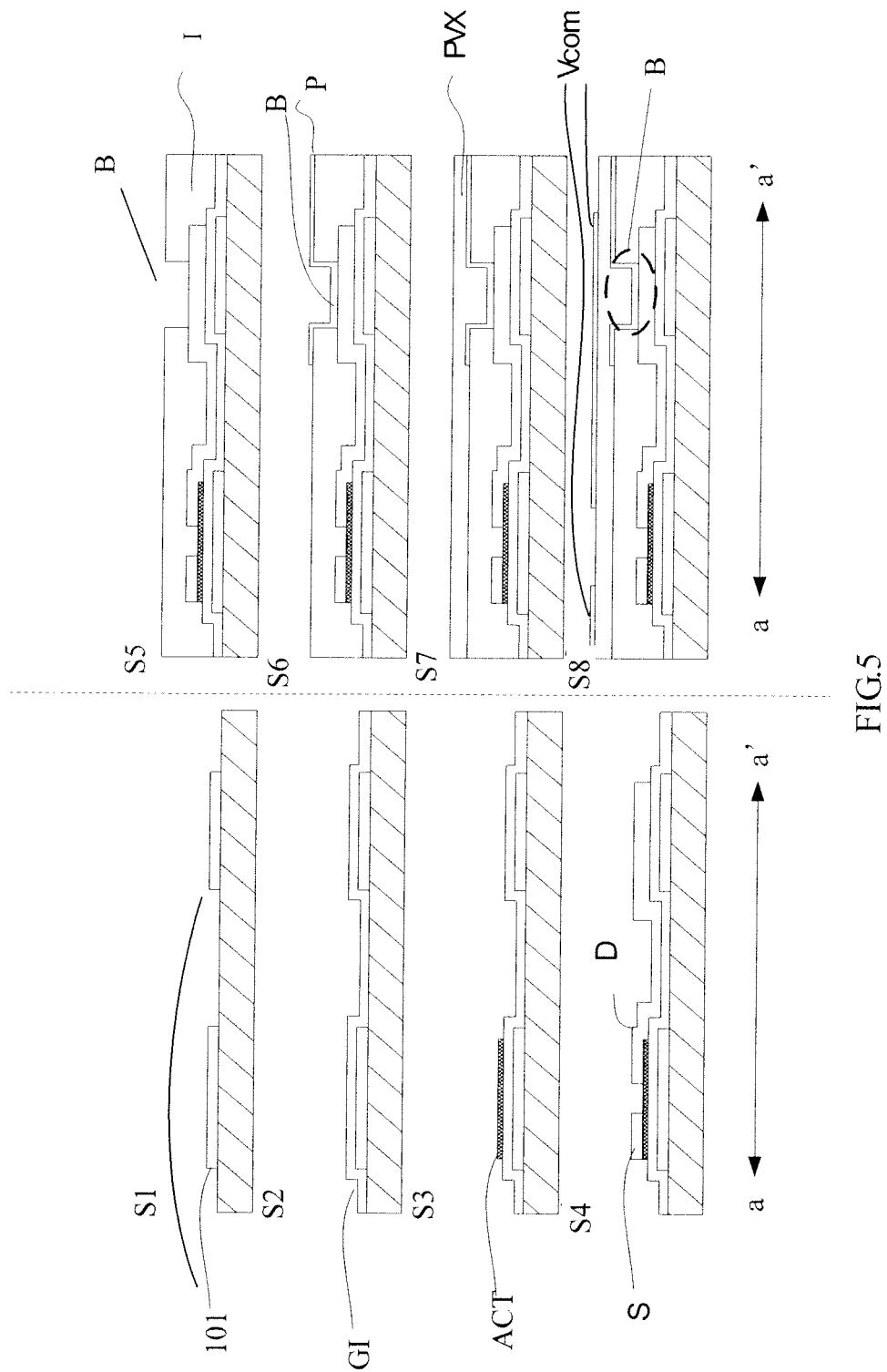
FIG. 5 is a structural view showing a cross-section of an array substrate provided by an embodiment of the invention at the end of individual manufacturing steps of the array substrate, the cross-section corresponding to a direction a-a' in FIG. 3.

FIG. 5 shows cross-sectional views illustrating the pixel structure of a TFT array substrate in which an L-shaped TFT is used, which correspond to the cross-sectional views of the pixel structure with an L-shaped TFT shown in FIG. 3 taken along the direction a-a'. Corresponding cross-sectional views at the end of each step among steps from step S1 to step S8 of manufacturing the array substrate in FIG. 3 are shown in FIG. 5. It is to be noted that, the manufacturing method will be described with reference to an example in which a pixel electrode and a drain electrode are connected with a via hole, but the invention is not limited thereto. With reference to those shown in FIG. 5, steps S1-S8 of the manufacturing method of the array substrate will be briefly described below.

Step S1, gate lines are formed through one patterning process. For example, by way of sputtering, exposure and etching, a gate electrode layer which comprises the gate lines 101 is fabricated on a glass substrate (or a plastic substrate), as shown by S1 in FIG. 5.

The patterning process referred to in the embodiments of the invention may comprise photoresist coating, masking, exposure, development, etching, photoresist stripping and other processes. Positive photoresist is described as an example of the photoresist, but the invention is not limited thereto.

Step S2, a gate insulating layer (GI layer) is formed. For example, the gate insulating layer may be fabricated by a vapor deposition method to cover the glass substrate and the above gate electrode layer, as shown by S2 in FIG. 5. The gate insulating layer may be for example an organic or inorganic insulating layer.

Step S3, an active layer (ACT layer) is fabricated on the gate insulating layer (GI), as shown in the left part of S3 in FIG. 5. The active layer may be a silicon semiconductor layer (of amorphous silicon or polysilicon) or an oxide semiconductor layer (e.g., of IGZO).

Step S4, a source-drain layer (SD layer) comprising a source electrode, a drain electrode and a data line is formed, as shown in the left part of S4 in FIG. 5. For example, the source electrode (S) is connected to the data line, and one terminal of the drain electrode (D) overlaps the top surface of a gate line on the right side, which is shown in the right part of S4 in FIG. 5.

Step S5, a second insulating layer I is formed on the SD layer so as to cover the source and drain electrodes and the gate insulating layer, and as shown in the right part of S5 in FIG. 5, form a via hole B at the end of the drain electrode. The second insulating layer I may be a resin layer.

Step S6, a first transparent electrode functioning as a pixel electrode P is formed. The pixel electrode P is connected to the drain electrode D through the via hole B in the second insulating layer I, as shown in the right part of S6 in FIG. 5. For example, the pixel electrode P is obtained by performing photolithography with a transparent conductive layer (such as an ITO layer).

Step S7, an insulating layer is formed on the pixel electrode P to function as a passivation layer (PVX layer), and the PVX layer covers the second insulating layer I and the pixel electrode P, as shown by S7 in FIG. 5.

Step S8, a second transparent electrode is formed on the top surface of the PVX layer to function as a common electrode Vcom, as shown in the right part of S8 in FIG. 5. The common electrode Vcom and the pixel electrode constitute a storage capacitor and an electric field for driving liquid crystals to deflect. For example, the common electrode Vcom is obtained by performing photolithography with a transparent conductive layer (such as an ITO layer).

The pixel electrode P and the common electrode Vcom may be formed with slits.

The whole S8 in FIG. 5 is the cross-sectional view corresponding to the pixel structure with the L-shaped TFT of the TFT array substrate shown in FIG. 3 taken along the direction a-a', and the via hole location B corresponds to a via hole location B in FIG. 3.

It is to be noted that, in the above method shown in FIG. 5, the SD layer and the ACT layer are formed, respectively, but they can also be formed in one photolithography process with one mask (e.g. a gray-tone or half-tone mask). In practice, the specific sequence of processes and the procedure may also be changed, as long as the structure of the TFT array substrate provided by the invention is finally achieved.

Preferably, referring to FIG. 3, there is a via hole C within the region of a common electrode line, and the via hole C acts to connect a common electrode and the common electrode line.

For example, with reference to cross-sectional views corresponding to the end of all the steps, which are in broken-line boxes on the left side in FIG. 6, and in combination with manufacturing steps of the structure corresponding to the location of the gate line, the manufacturing process of the via hole within the region of the common electrode line is as follows.

Figure 6:
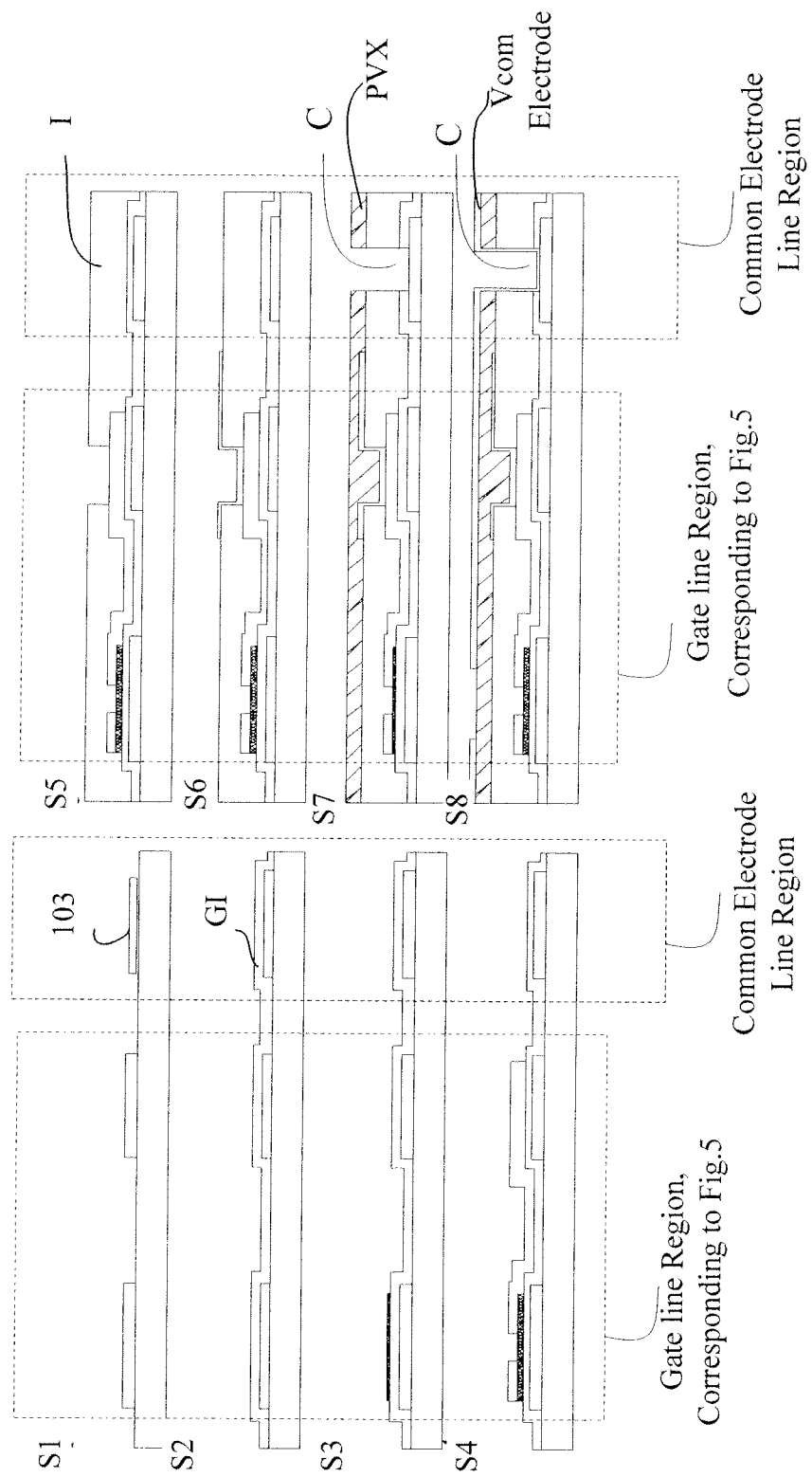
FIG. 6 is a structurally cross-sectional view showing an array substrate provided by an embodiment of the invention at the end of individual manufacturing steps of the array substrate, a portion in a broken-line box on the right side corresponding to a cross-section centered on C in FIG. 3.

In the step S1, a common electrode line 103 is further comprised in the gate electrode layer, as shown in the right part of S1 in FIG. 6.

Above the common electrode, after the steps S2, S5 and S7, on the top surface of the common electrode, three insulating layers comprising the gate insulating layer (GI), the second insulating layer I and the passivation layer (PVX) are deposited from bottom to top, respectively. In the step S7, the via hole C is etched out in the stack of the above three layers, as shown in the left part of S7 in FIG. 6; it is to be noted that, the process flow to obtain the via hole C may be achieved by one etching, and may also be achieved by separately etching the three layers, and the embodiments of the invention are not limited thereto.

In the step S8, the common electrode Vcom is formed, and is connected to the common electrode line located in the gate electrode layer, as shown by C in the right part of S8 in FIG. 6.

Preferably, within the region of each common electrode line, the number of via holes C is at least two; preferably, the number of the via holes C is the number of the pixel unit columns in the array substrate, and the via holes C are arranged periodically along the common electrode line.

With the structure shown by S8 in FIG. 6, according to the embodiment, a transverse common electrode line in the gate electrode layer is added in a pixel area, and is conducted to common electrodes Vcom periodically. This reduces the resistance of the common electrodes Vcom to a great extent, and prevents disadvantageous phenomenon which is caused by large resistance of the common electrodes Vcom such as crosstalk or the like from occurring.

Figure 7:
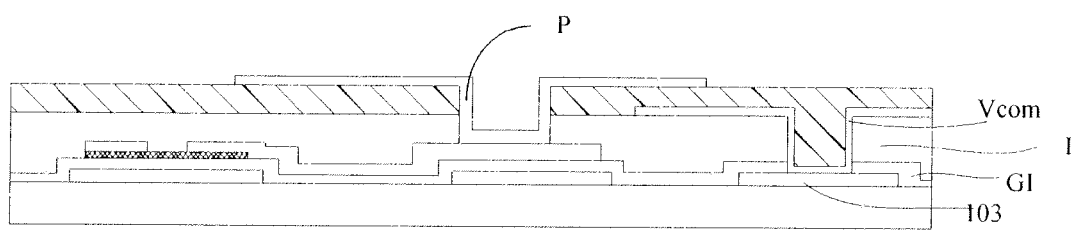
FIG. 7 is a schematically cross-sectional view showing another TFT array substrate provided by an embodiment of the invention.

It is to be noted that, in the above structure of the array substrate, the second transparent conductive layer is used as the common electrode Vcom. However, in an embodiment of the invention, it is also possible that the first transparent conductive layer is used as the common electrode Vcom, and the second transparent conductive layer is used as the pixel electrode P. A cross-section of a TFT array substrate with the first transparent conductive layer being used as the common electrode Vcom is shown in FIG. 7.

Additionally, other materials may also be used for the second insulating layer I, the passivation layer (PVX) and other insulating layers in the above processes, as long as insulating effect can be obtained.

A liquid crystal display panel provided by an embodiment of the invention employs an array substrate which comprises the above pixel structure.

Figure 9:
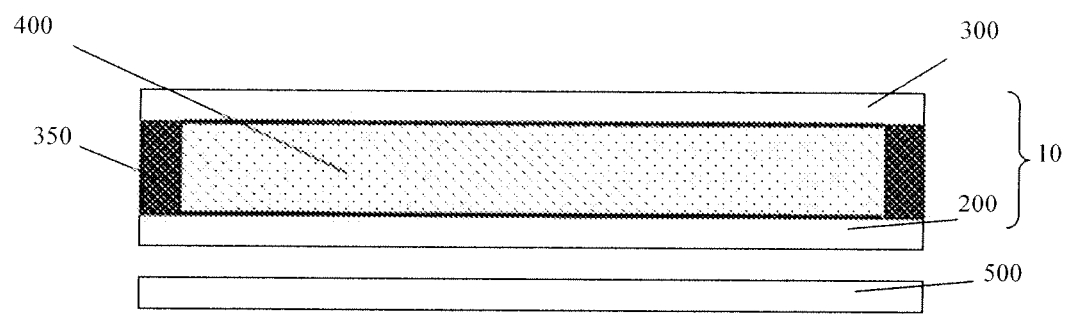
FIG. 9 is a schematically cross-sectional view showing a liquid crystal display panel provided by an embodiment of the invention.

As shown in FIG. 9, the display panel 10 comprises a counter substrate 300 and an array substrate 200 according to any of the above embodiments, which are assembled together to form a cell. The counter substrate 300 comprises a black matrix corresponding to pixel units of the array substrate. The array substrate 200 and the counter substrate 300 are disposed opposite to each other so as to form a liquid crystal cell, and the liquid crystal cell with a liquid crystal material 400 filled therein is sealed by sealant 350. The counter substrate 300 is a color filter substrate for example, black matrices on which define pixel units corresponding to the pixel units on the array substrate 200, and in all of the pixel units of the color filter substrate, there are formed color filters respectively, such as RGB filters. In some examples, the liquid crystal display device 10 further comprises a backlight source 500 for providing backlight for display, for example, which is located below the array substrate 300.

Preferably, in the liquid crystal display panel 10, in the direction of light transmission (perpendicular direction in FIG. 9), the projection of gate lines and common electrode lines on the array substrate falls within the projection of the black matrices on the color filter substrate.

Figure 8:
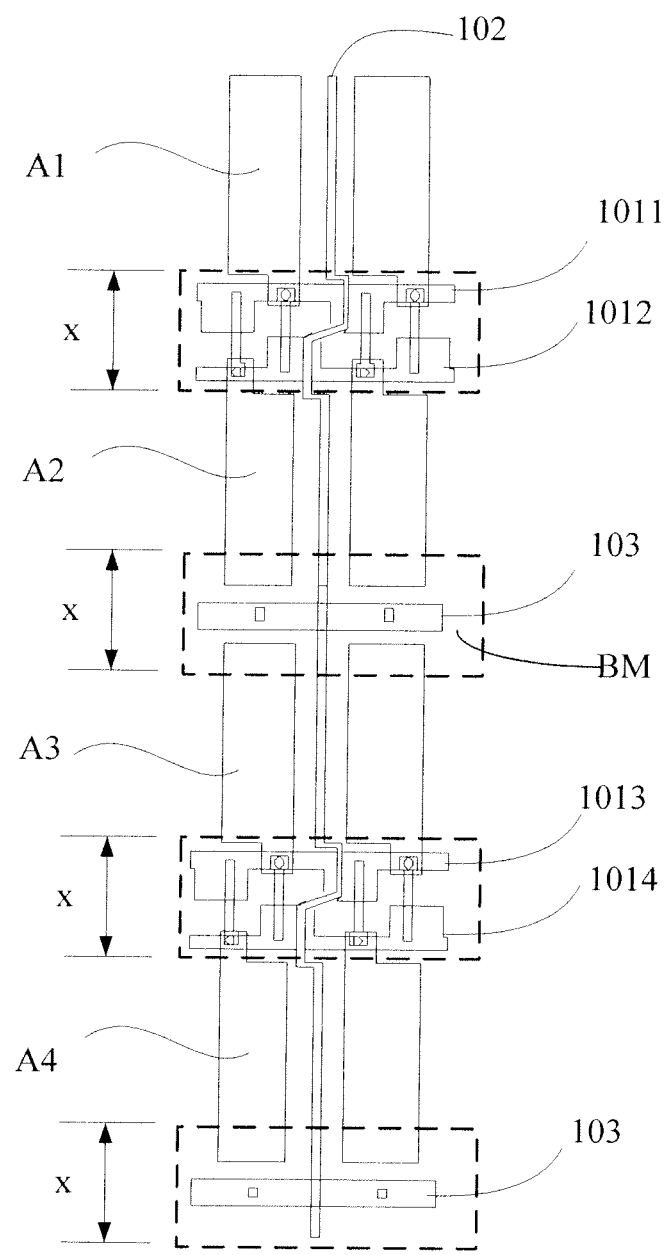
FIG. 8 is a schematically top view showing a part of a liquid crystal display panel provided by an embodiment of the invention.

Preferably, for the liquid crystal display panel 10, on the counter substrate, a black matrix corresponding to the position of the gate lines and a black matrix corresponding to a common electrode line have a same shape. Referring to FIG. 8, which is a top view of four pixel units from in the longitudinal direction in the same column, broken-line boxes corresponding to black matrices on the counter substrate side, the black matrix corresponding to the position of the gate lines is flush with the exterior periphery of the gate lines and has an overall flat profile, and conforms with the black matrix corresponding to the position of the common electrode line. Therefore, sizes of display pixel units in adjacent rows in the display panel 10 are also the same, and horizontal stripes will not occur.

According to another embodiment of the invention, there is further provided a gate driving method for an array substrate which is such as an array substrate in any of the above embodiments, the method comprising the following steps.

With respect to two gate lines which are adjacent to each other and located between two adjacent rows of pixel units, the gate line in a following row of the two gate lines which are adjacent is scanned earlier, and the gate line in a preceding row of the two gate lines which are adjacent is scanned later;

Or, the gate line in the preceding row of the two gate lines which are adjacent is scanned earlier, and the gate line in the following row of the two gate lines which are adjacent is scanned later.

For example, with reference to FIG. 8, which shows four pixel units which are adjacent in the longitudinal direction, gate lines 1011, 1012, 1013, 1014 . . . are gate lines arranged in the longitudinal direction in sequence, and these gate lines are divided in pairs and each pair is distributed between two adjacent rows of pixel units. With respect to the driving order of these gate lines, in case of a forward scanning, it is 1012-1011-1014-1013 . . . and the rest are scanned in the same way, so as to ensure switching-on order of the pixel units is from beginning to end; and in the case of a backward scanning, the driving order is 1013-1014-1011-1012 . . . and the rest are scanned in the same way.

From the above, an array substrate, a liquid crystal display panel and a driving method are provided in embodiments of the invention, in which, the connection location of a pixel electrode and a drain electrode of a thin film transistor is provided between gate lines for adjacent pixel units or over a gate line, gate electrodes of two pixel units, which are vertically adjacent, of pixel units can be made to be staggered and opposed as well, and therefore TFTs of the two pixel units which are vertically adjacent are opposed. Therefore, a black matrix corresponding to gate lines has an edge parallel to an edge of the gate lines, and conforms to a black matrix which corresponds to a common electrode line and has a flat profile. As such, the openings of all of the pixel units have a same size and uniform appearance, and display horizontal stripes which are generated by difference between black matrices for adjacent rows are avoided. Furthermore, when the pixel electrode and the drain electrode are connected through a via hole, an area of the black matrix which is specially added for preventing light leakage from the via hole can also be avoided, and this enlarges the aperture ratio.

The foregoing are merely exemplary embodiments of the invention, but are not used to limit the protection scope of the invention. The protection scope of the invention is determined by appended claims.

The invention claimed is:

1. An array substrate, comprising: a plurality of data lines and a plurality of gate lines which are provided to intersect each other, and a plurality of pixel units, which are defined by enclosing by the plurality of data lines and the plurality of gate lines and are arranged in an array form, and each of which comprises a thin film transistor and a pixel electrode, the thin film transistor comprising a gate electrode, a source electrode connected to a corresponding data line and a drain electrode connected to the pixel electrode, wherein two gate lines which are adjacent to each other are located between corresponding pixel units in two adjacent rows driven by the two gate lines, and for each of the pixel units in the two adjacent rows, a connection position of the drain electrode of the thin film transistor and the pixel electrode is between the two gate lines or over one corresponding gate line;

wherein, for two pixel units in two adjacent rows and in a same column, the gate line in a preceding row of the two gate lines which are adjacent acts to drive a pixel unit in a following row of the two pixel units in the two adjacent rows, and the gate line in the following row of the two gate lines which are adjacent acts to drive a pixel unit in the preceding row of the two pixel units in the two adjacent rows.

2. The array substrate according to claim 1, wherein the gate lines comprise protrusions, and the protrusions of the two gate lines, which are adjacent and used to drive the pixel units in the two adjacent rows, are staggered and opposed in a column direction.

3. The array substrate according to claim 1, wherein for each of the pixel units in the two adjacent rows, the drain electrode of the thin film transistor is connected to the pixel electrode through a first via hole.

4. The array substrate according to claim 1, further comprising a plurality of common electrode lines, wherein two adjacent rows of the common electrode lines are separated by the pixel units in the two adjacent rows, and the common electrode lines are connected to common electrodes of the pixel units through second via holes.

5. The array substrate claimed as claim 4, wherein the number of the second via holes for connecting the common electrode lines and the common electrodes of the pixel units are at least two.

6. A liquid crystal display panel, comprising a color filter substrate and an array substrate which are disposed opposite to each other, wherein the array substrate according to claim 1.

7. The liquid crystal display according to claim 6, wherein in a direction of light transmission of the liquid crystal display panel, projection of the gate lines falls within projection of a black matrix of the counter substrate.

8. The liquid crystal display panel according to claim 6, wherein on the counter substrate, a profile of a black matrix corresponding to a position of the gate lines and a profile of a black matrix corresponding to a position of a common electrode line are the same.

9. A driving method for driving the array substrate according to claim 1, comprising:
- with respect to the two gate lines which are adjacent and located between the pixel units in the two adjacent rows, a gate line in a following row of the two gate lines which are adjacent is scanned earlier, and a gate line in a preceding row of the two gate lines which are adjacent is scanned later; or,
- with respect to the two gate lines which are adjacent and located between the pixel units in the two adjacent rows, a gate line in a preceding row of the two gate lines which are adjacent is scanned earlier, and a gate line in a following row of the two gate lines which are adjacent is scanned later.

* * * * *